(12) United States Patent
Endo et al.

(10) Patent No.: US 9,668,347 B2
(45) Date of Patent: May 30, 2017

(54) ELECTRIC PART SOLDERED ONTO PRINTED CIRCUIT BOARD

(71) Applicant: DAI-ICHI SEIKO CO., LTD., Kyoto (JP)

(72) Inventors: Takayoshi Endo, Shizuoka (JP); Kenya Ando, Shizuoka (JP)

(73) Assignee: DAI-ICHI SEIKO CO., LTD., Kyoto (JP)

( * ) Notice: Subject to any disclaimer, the term of this patent is extended or adjusted under 35 U.S.C. 154(b) by 0 days.

(21) Appl. No.: 14/484,537

(22) Filed: Sep. 12, 2014

(65) Prior Publication Data

US 2015/0083478 A1 Mar. 26, 2015

(30) Foreign Application Priority Data

Sep. 20, 2013 (JP) .................... 2013-195877

(51) Int. Cl.
| H05K 1/11 | (2006.01) |
|---|---|
| H05K 1/18 | (2006.01) |
| H01R 12/70 | (2011.01) |
| H01R 12/72 | (2011.01) |
| H01R 43/02 | (2006.01) |
| H01R 43/16 | (2006.01) |
| H01R 4/02 | (2006.01) |
| H05K 3/30 | (2006.01) |

(52) U.S. Cl.
CPC .............. *H05K 1/181* (2013.01); *H01R 4/02* (2013.01); *H01R 12/707* (2013.01); *H01R 12/724* (2013.01); *H01R 43/0256* (2013.01); *H01R 43/16* (2013.01); *H05K 3/303* (2013.01); *H05K 2201/10439* (2013.01); *H05K 2201/10613* (2013.01); *Y10T 29/49149* (2015.01); *Y10T 29/49204* (2015.01)

(58) Field of Classification Search
CPC ...... H05K 1/181; H05K 3/303; H01R 12/707; H01R 4/02; H01R 12/724
USPC ................. 174/261, 250, 255–260
See application file for complete search history.

(56) References Cited

U.S. PATENT DOCUMENTS

| 6,379,161 B1 | 4/2002 | Ma |
| 2013/0273782 A1 | 10/2013 | Muro |

FOREIGN PATENT DOCUMENTS

| JP | 4-27148 | 1/1992 |
| JP | 4-171854 | 6/1992 |
| JP | 9-45395 | 2/1997 |
| JP | 9-69598 | 3/1997 |
| JP | 11-054895 | 2/1999 |
| JP | 2010-225439 | 10/2010 |
| JP | 2012-138183 | 7/2012 |

OTHER PUBLICATIONS

Japanese Office Action issued Nov. 5, 2013 in Application No. 2013-195877, with English translation.

*Primary Examiner* — Tremesha S Willis
(74) *Attorney, Agent, or Firm* — Wenderoth, Lind & Ponack, L.L.P.

(57) ABSTRACT

The electric part to be soldered to a metal pad mounted on a printed circuit board, includes a first surface facing the metal pad, a second surface extending from the first surface in a direction away from the metal pad, and a third surface outwardly extending from the second surface, the second surface and the third surface defining a space in which solder is stored.

11 Claims, 20 Drawing Sheets

FIG. 11A - PRIOR ART
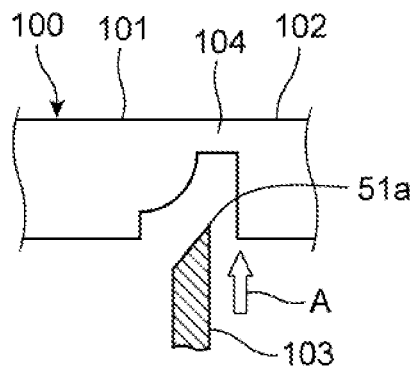
FIG. 11B - PRIOR ART
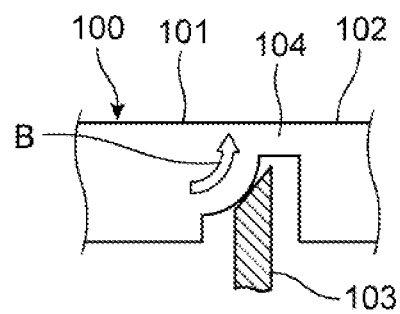
FIG. 11C - PRIOR ART
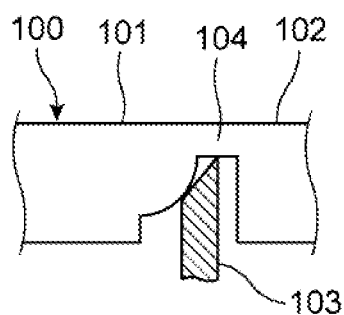

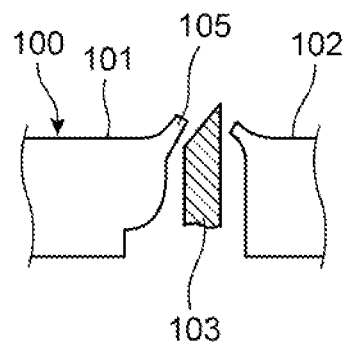
FIG. 11D- PRIOR ART

ELECTRIC PART SOLDERED ONTO PRINTED CIRCUIT BOARD

BACKGROUND OF THE INVENTION

Field of the Invention

The invention relates to an electric part to be soldered to a metal pad mounted on a printed circuit board, and further to a method of fabricating the same.

Description of the Related Art

There is known an electric connector to be mounted on a metal pad formed on a printed circuit board and made of a thin metal sheet. The electric connector generally includes a connector terminal to be electrically connected to another electric connector, or an electric part called a hold-down for fixing a housing onto a printed circuit board. The connector terminal or the hold-down (hereinafter, simply called an "electric part") is soldered to a metal pad to thereby fix the electric connector onto the printed circuit board.

An example of such an electric part is suggested in Japanese Patent Application Publication No. 2012-138183.

As illustrated in FIG. 11A, a terminal 100 suggested in the Publication includes a lead 101 connected to a connector 102 of a carrier. Both the lead 101 and the connector 102 are plated with tin to thereby form a thin notch 104 between the lead 101 and the connector 102. As illustrated in FIGS. 11B and 11C, the notch 104 is cut by means of a cutter 103, resulting in that there are formed fillets 105 comprised of portions of the notch 104, as illustrated in FIG. 11D.

The upwardly bending fillets 105 ensure that an area of a tin plating layer to which solder is fixed can be increased, and thus, there can be formed large solder fillets between the fillets 105 and a metal pad when the terminal 100 is soldered onto the metal pad.

If a metal plate plated at opposite surfaces thereof were simply cut, a non-plated material (a mother material) is exposed at a surface along which the metal plate was cut. A non-plated surface has low solder wettability. The fillets 105 are formed by cutting the notch 104 by means of the cutter 103 in the terminal 100 illustrated in FIGS. 11A to 11D. Thus, the notch 104 is stretched to be thin, and hence, the fillets 105 have a plated surface.

However, when the notch 104 is cut for forming the fillets 105, the notch 104 may be broken before the notch 104 is stretched to be thin. Thus, it is quite difficult to ensure an area of a tin-plated layer to be large merely by cutting the notch 104 to thereby stretch the notch 104 to be thin.

A peel resistance for an electric part to be peeled from a metal pad is dependent on a size of an area by which the electric part is soldered to the metal pad. Accordingly, it is necessary to make the area larger for the purpose of increasing the peel resistance. By increasing the peel resistance, the electric part can have an enhanced peel resistance to oscillation and/or impact, and further, the electric part can have a strength in such a case that a cable to which an electric connector is connected is pulled, ensuring enhancement in electrical connection between the electric part and a metal pad.

SUMMARY OF THE INVENTION

In view of the above-mentioned problems in the conventional electric part of an electric connector, it is an object of the present invention to provide an electric part of an electric connector having an increased peel resistance against being peeled from a printed circuit board to thereby provide enhanced reliability to electrical connection between the electric part and a printed circuit board.

It is further an object of the present invention to provide a method of fabricating the above-mentioned electric part.

In one aspect of the present invention, there is provided an electric part to be soldered to a metal pad formed at a surface of a printed circuit board, including a first surface facing the metal pad, a second surface extending from the first surface in a direction away from the metal pad, and a third surface outwardly extending from the second surface, the second surface and the third surface defining a space in which solder is stored.

The electric part in accordance with the present invention is designed to have the space for storing solder therein when the electric part is soldered to a metal pad. Since solder is adhered to the second and third surfaces when the space is filled with solder, a peel resistance of the part against being peeled from a metal pad can be increased. Furthermore, solder filled in the space defines a fillet having a height from the first surface to the third surface. Thus, it is possible to increase an area by which the electric part is soldered to a metal pad, and the fillet increases a peel resistance.

It is preferable that the second surface inclines relative to the first surface.

By designing the second surface to incline relative to the first surface, it is possible to have an increased area by which the pad is soldered to a metal pad, in comparison with the second surface designed to vertically stand, ensuring a peel resistance.

It is preferable that the electric part includes a first portion facing the metal pad, and a second portion extending away from the metal pad, and a corner portion connecting the first and second portions to each other, the first to third surfaces being formed on the first portion to the second portion through the corner portion.

By designing the first to third surfaces to form from the first portion to the second portion through the corner portion, an area by which the electric part is soldered to a metal pad can be increased.

For instance, an end surface of the electric part may be not plated.

Even if an end surface of the electric part is not plated, the electric part can be surely soldered to a metal pad by virtue of the fillet having a height from the first surface to the third surface.

It is preferable that an end surface of the electric part is plated.

By designing an end surface of the electric part to be plated, the fillet can extend a height thereof to an end surface of the electric part located higher than the third surface. Thus, an area by which the electric part is soldered to a metal pad can be increased by an area of the end surface of the electric part. The increased area and the fillet having an extended height enhance a peel resistance.

It is preferable that at least one of the first to third surfaces is formed with a plurality of recesses.

By designing at least one of the first to third surfaces to be formed with a plurality of recesses, an area by which the electric part is soldered to a metal pad can be increased.

In another aspect of the present invention, there is provided an outer lead of a connector terminal to be soldered to a metal pad formed at a surface of a printed circuit board, including a first surface facing the metal pad, a second surface extending from the first surface in a direction away from the metal pad, and a third surface outwardly extending from the second surface, the second surface and the third surface defining a space in which solder is stored.

In still another aspect of the present invention, there is provided an electric part through which a housing is fixed onto a printed circuit board, the electric part including a first portion making contact with the housing, and a second portion soldered to the printed circuit board, the second portion including a first surface facing the printed circuit board, a second surface extending from the first surface in a direction away from the printed circuit board, and a third surface outwardly extending from the second surface, the second surface and the third surface defining a space in which solder is stored.

In yet another aspect of the present invention, there is provided a method of fabricating an electric part including punching a metal to make a base part having a predetermined contour, and reducing a thickness of the base part at a margin thereof to thereby define the first to third surfaces.

It is preferable that the method further includes cutting an extended portion of the base part formed by reducing a thickness of the base part, in a direction from a surface through which the electric part is soldered to the printed circuit board towards an opposite surface.

By cutting the extended portion in the above-mentioned direction, burr is generated at an end surface located opposite to a printed circuit board. Thus, burr does not interfere with the electric part to be soldered to a metal pad.

The advantages obtained by the aforementioned present invention will be described hereinbelow.

The present invention makes it possible to increase an area by which the electric part is soldered to a metal pad, and further, to form a fillet for a metal pad, ensuring that a peel resistance can be increased. Thus, the present invention provides enhanced reliability to electrical connection between the electric part and a metal pad and accordingly a printed circuit board.

The above and other objects and advantageous features of the present invention will be made apparent from the following description made with reference to the accompanying drawings, in which like reference characters designate the same or similar electric parts throughout the drawings.

BRIEF DESCRIPTION OF THE DRAWINGS

FIGS. 11A to 11D illustrate steps of fabricating the conventional electric part.

DESCRIPTION OF THE PREFERRED EMBODIMENTS

Preferred embodiments in accordance with the present invention will be explained hereinbelow with reference to drawings.

Figure 1:
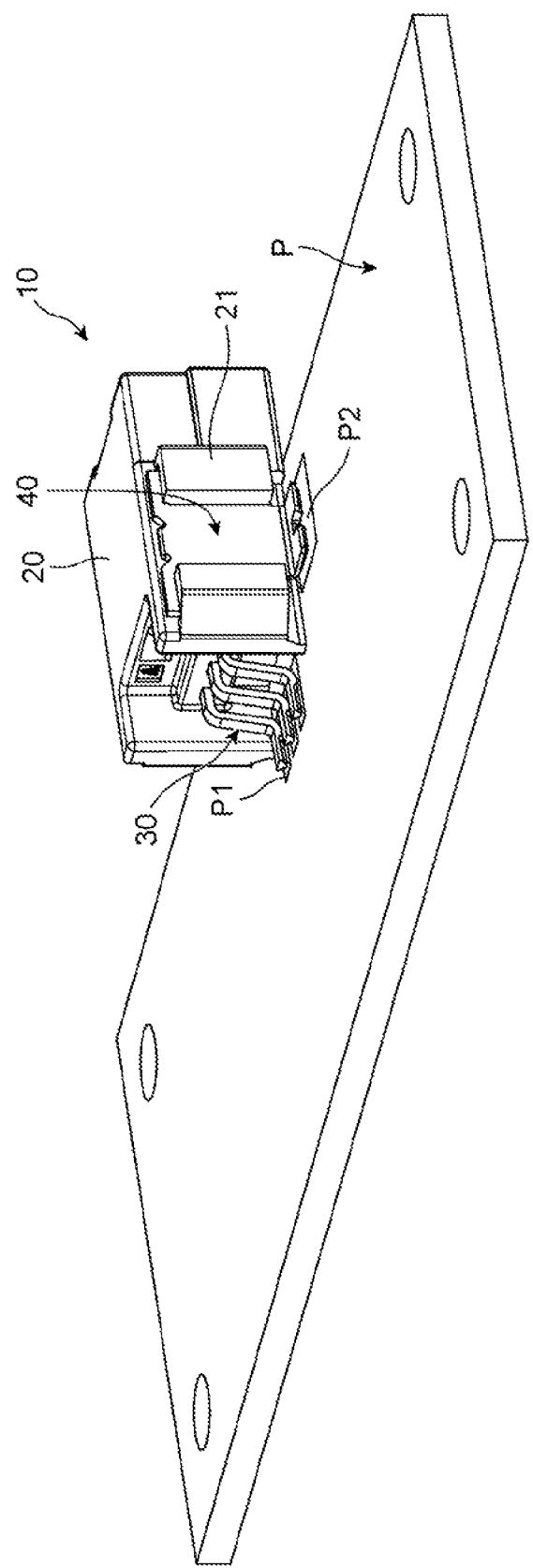
FIG. 1 is a perspective view of the electric connector in accordance with the preferred embodiment of the present invention, the electric connector being mounted on a printed circuit board.
Figure 2:
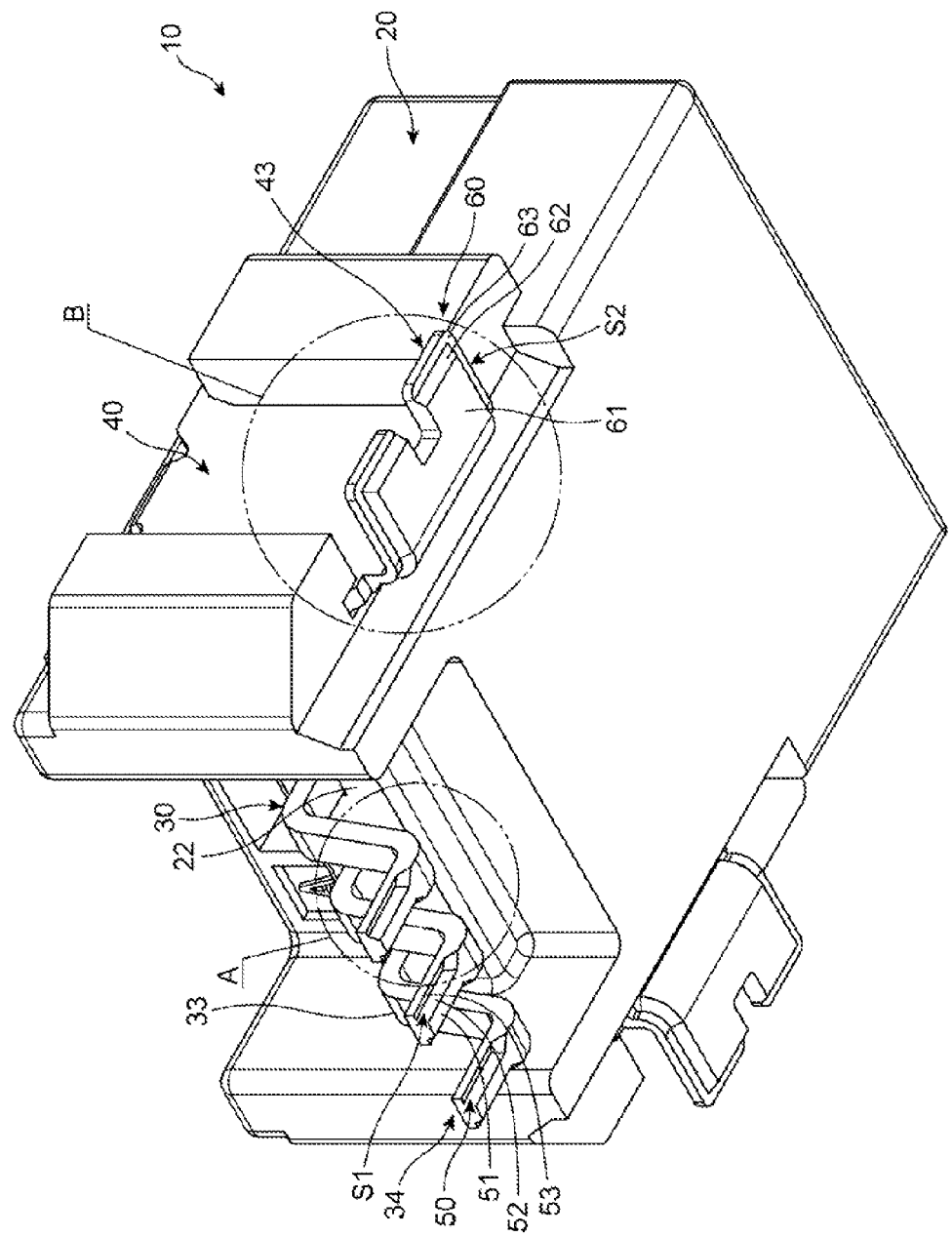
FIG. 2 is a lower perspective view of the electric connector in accordance with the preferred embodiment of the present invention.

As illustrated in FIGS. 1 and 2, an electric connector 10 in accordance with the embodiment is a male connector to be mounted on a printed circuit board P. The electric connector 10 is soldered onto metal pads P1 and P2 formed at a surface of the printed circuit board P. The metal pad P1 defines a terminal through which signals are transmitted to circuits formed on the printed circuit board P, and the metal pad P2 is used for fixing the electric connector 10 on the printed circuit board P.

The electric connector 10 includes a housing 20 into which another electric connector (not illustrated) is fit, a plurality of connector terminals 30 housed in a terminal space formed in the housing 20, and each electrically connecting another electric connector, and a fixing part 40 for fixing the housing 20 onto the printed circuit board P.

The housing 20 is formed with an opening (not illustrated) through which another electric connector is fit into the housing 20, and thus, is in the form of a box being open at a front. The housing 20 is formed at opposite sides thereof with holders 21 for equipping the fixing part 40 therewith. The holder 21 defines a slot into which the fixing part 40 is inserted for fixing the fixing part 40 in the holder 21.

The connector terminals 30 are aligned in a line relative to the housing 20. Each of the connector terminals 30 comprises a male terminal, and is soldered onto a metal pad P1 (see FIG. 1) formed at a surface of the printed circuit board P. Each of the connector terminals 30 is plated, and accordingly, has a plated surface through which each of the connector terminals 30 makes contact with the metal pad P1, and a plated surface located oppositely to the first-mentioned plated surface.

As illustrated in FIGS. 3A to 3G, the connector terminal 30 includes a pin section 31 in the form of a needle, a main body 32, and an outer lead 33 through which the connector terminal 30 is soldered to the metal pad P1 formed at a surface of the printed circuit board P1.

The pin section 31 is inserted into a female connector of another electric connector to thereby electrically connect with the electric connector. The main body 32 is housed in the terminal space formed in the housing 20. The main body 32 is formed with a pair of wedges 32a to be engaged with a wall 22 (see FIG. 2) of the housing 20 when the connector terminal 30 is inserted into the housing, and a pair of extended portions 32b through which a user pushes the connector terminal 30 into the housing 20.

The wedges 32a are formed at opposite sides in a width-wise direction of the main body 32. Each of the wedges 32a has a tapered surface inclining in a direction in which the connector terminal 30 is inserted into the housing 20, and is engaged with a sidewall of the terminal space formed within the wall 22 in the housing 20. Each of the extended portions 32b has a rectangular cross-section, and projects in a direction perpendicular to a direction in which the connector terminal 30 is inserted into the housing 20.

The outer lead 33 is in the form of a crank. The outer lead 33 is formed at a distal end thereof with a contact portion 34 through which the connector terminal 30 is soldered to the metal pad P1. Before being inserted into the housing 20, the connector terminal 30 is in the form of a line from the pin section 31 to the contact portion 34 through the main body 32 and the outer lead 33. After being inserted into the housing 20, a distal portion is first bent downwardly, and further bent horizontally to thereby define the crank-shaped outer lead 33.

The fixing part 40 comprises a so-called "hold-down" to be supported by the holder 21 (see FIG. 2), and further, to be soldered onto the metal pad P2 (see FIG. 1) formed at a surface of the printed circuit board P. The fixing part 40 is entirely plated with a metal such as tin, and hence, has opposite plated surfaces. The fixing part 40 is substantially L-shaped when viewed from a side.

As illustrated in FIGS. 4A to 4G, the fixing part 40 includes a main body 41, and a leg 42 extending perpendicularly for the main body 41. The fixing part 40 is fixed to the metal pad P2 by soldering the leg 42 onto the metal pad P2.

The main body 41 includes a plurality of wedges 41a to be engaged with the holder 21, and a pair of extended portions 41b through which a user pushes the fixing part 40 into the holder 21.

The wedges 41a are formed at opposite sides of the main body 41 in a width-wise direction of the main body 41. Each of the wedges 41a has a tapered surface inclining in a direction in which the fixing part 40 is inserted into the holder 21, and is engaged with a groove (not illustrated) formed in the holder 21. Each of the extended portions 41b has a rectangular cross-section, and projects in a direction perpendicular to a direction in which the fixing part 40 is inserted into the holder 21.

The leg 42 has a substantially L-shaped cross-section when viewed from a side, and is formed at a distal end thereof with a contact portion 43 through which the fixing part 40 is soldered onto the metal pad P2.

The contact portion 34 of the outer lead 33 and the contact portion 43 of the leg 42 are explained hereinbelow with reference to FIGS. 3A to 3G and 4A to 4G.

The contact portion 34 includes a first surface 51 facing the metal pad P1, a second surface 52 circumferentially extending from the first surface 51 in a direction away from the metal pad P1, and a third surface 53 outwardly circumferentially extending from the second surface 52. The second surface 52 and the third surface 53 define a stepped portion 50. Furthermore, the second surface 52 and the third surface 53 define a space S1 together with the metal pad P1 in which solder is stored.

The contact portion 43 includes a first surface 61 facing the metal pad P2, a second surface 62 circumferentially extending from the first surface 61 in a direction away from the metal pad P2, and a third surface 63 outwardly circumferentially extending from the second surface 62. The second surface 62 and the third surface 63 define a stepped portion 60. Furthermore, the second surface 62 and the third surface 63 define a space S2 together with the metal pad P2 in which solder is stored.

The first surfaces 51 and 61 are designed to have an area which is as large as possible. The first surfaces 51 and 61 face the metal pads P1 and P2 in parallel when the electric connector 10 is mounted on the printed circuit board P.

The second surfaces 52 and 62 incline relative to the metal pads P1 and P2. The third surfaces 53 and 63 extend from upper ends of the second surfaces 52 and 62 almost in parallel with the metal pads P1 and P2.

A method of fabricating both the contact portion 34 of the connector terminal 30 and the contact portion 43 of the fixing part 40 is explained hereinbelow with reference to FIGS. 5A to 5D.

First, a metal sheet is punched into a predetermined shape from which each of the connector terminal 30 and the fixing part 40 is fabricated.

Figure 5A:
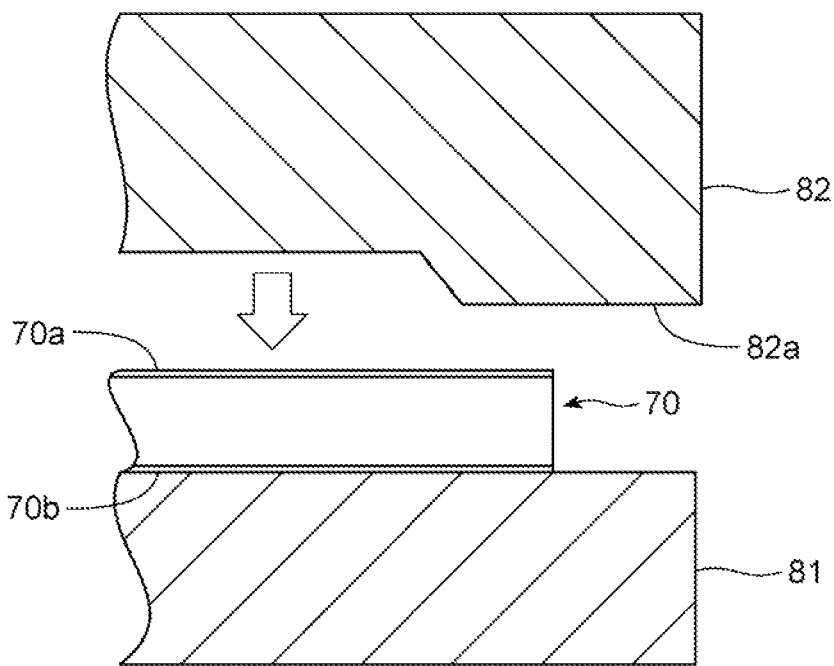
FIGS. 5A to 5D illustrate subsequent steps in a method of fabricating the electric part.

Then, a square bar for fabricating the connector terminal 30 or a plate for fabricating the fixing part 40 is put on a die 81 having a flat surface, as illustrated in FIG. 5A. Each of the square bar and the plate has a margin portion 70, and is plated to thereby have plating layers 70a and 70b, that is, thin metal layers formed on upper and lower surfaces thereof.

Figure 3A:
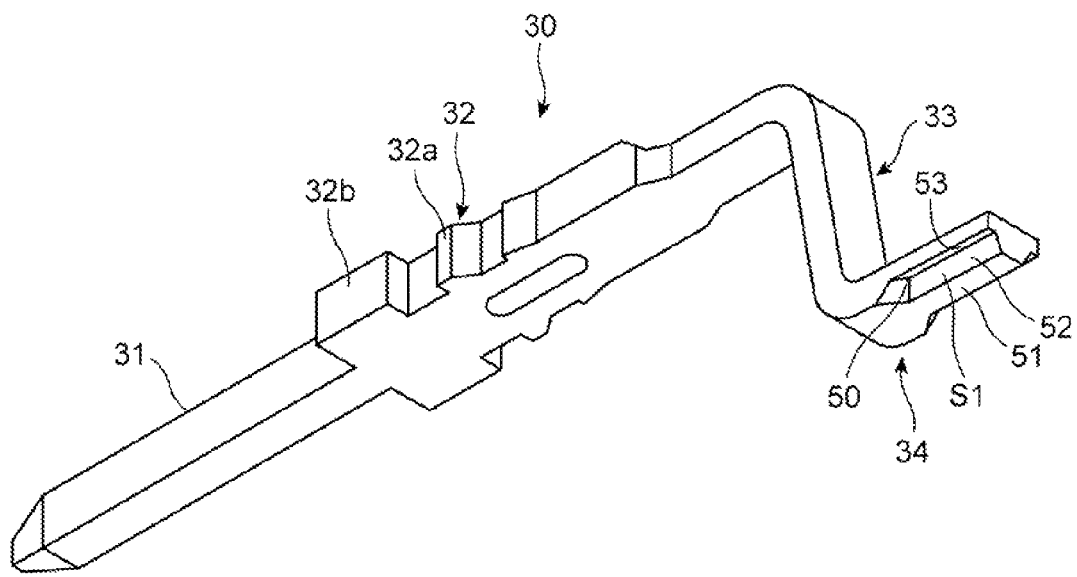
FIG. 3A is a lower perspective view of the connector terminal defining an electric part of the electric connector in accordance with the preferred embodiment of the present invention.
Figure 3B:
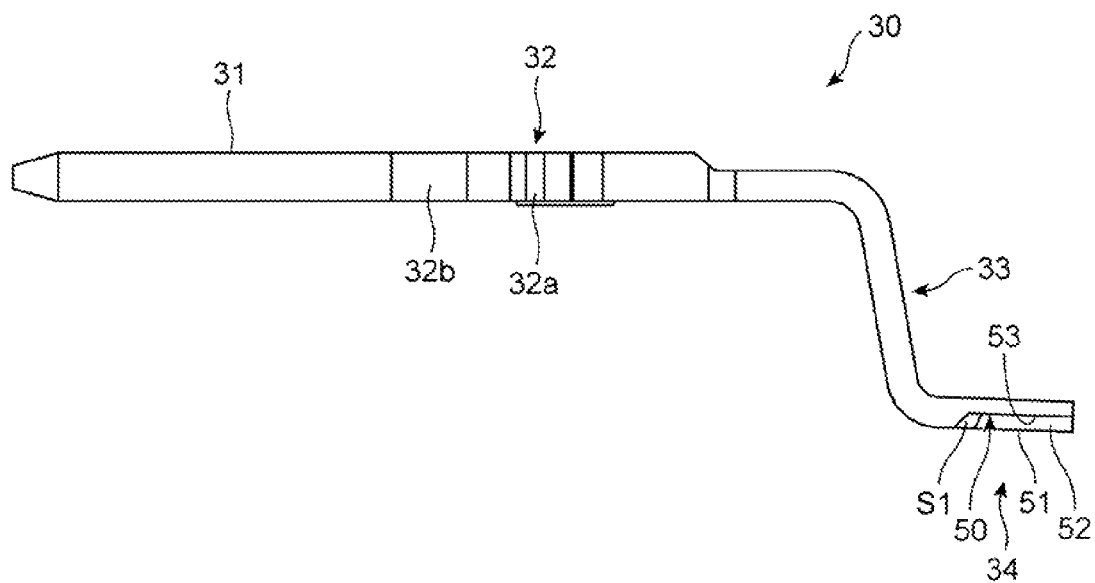
FIG. 3B is a right side view of the connector terminal.
Figure 3C:
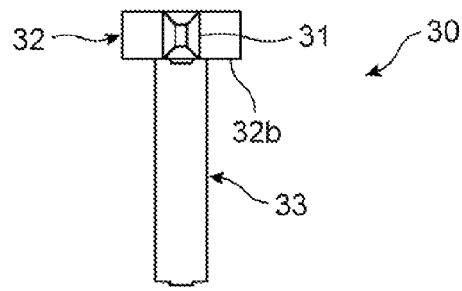
FIG. 3C is a front view of the connector terminal.
Figure 3D:
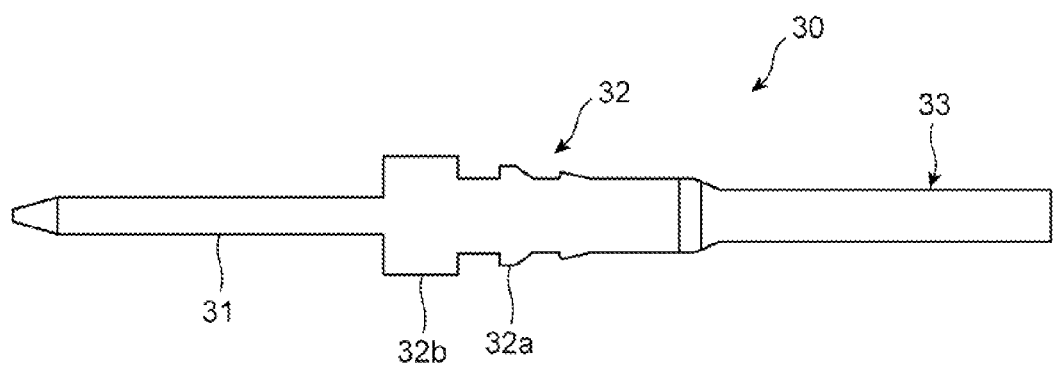
FIG. 3D is a plan view of the connector terminal.
Figure 3E:
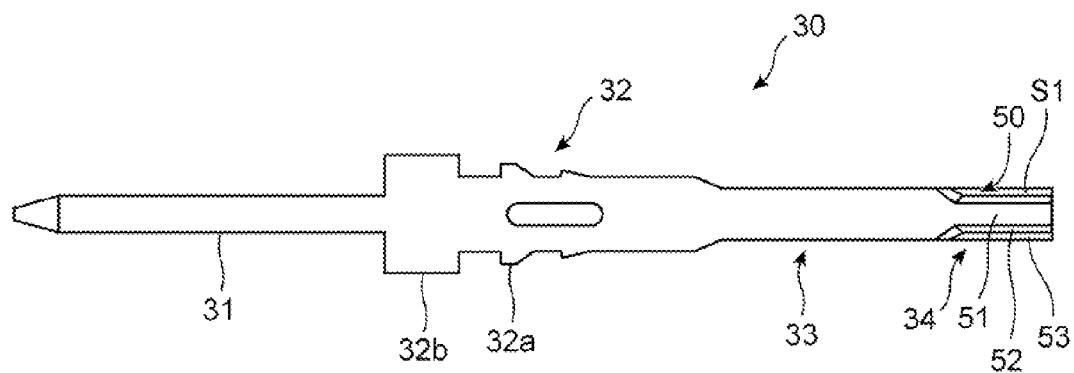
FIG. 3E is a bottom view of the connector terminal.
Figure 3F:
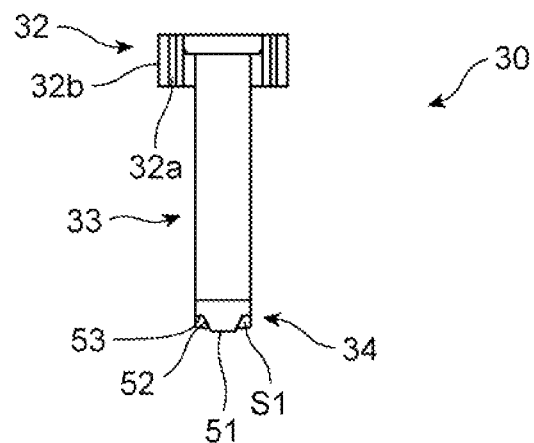
FIG. 3F is a rear view of the connector terminal.
Figure 3G:
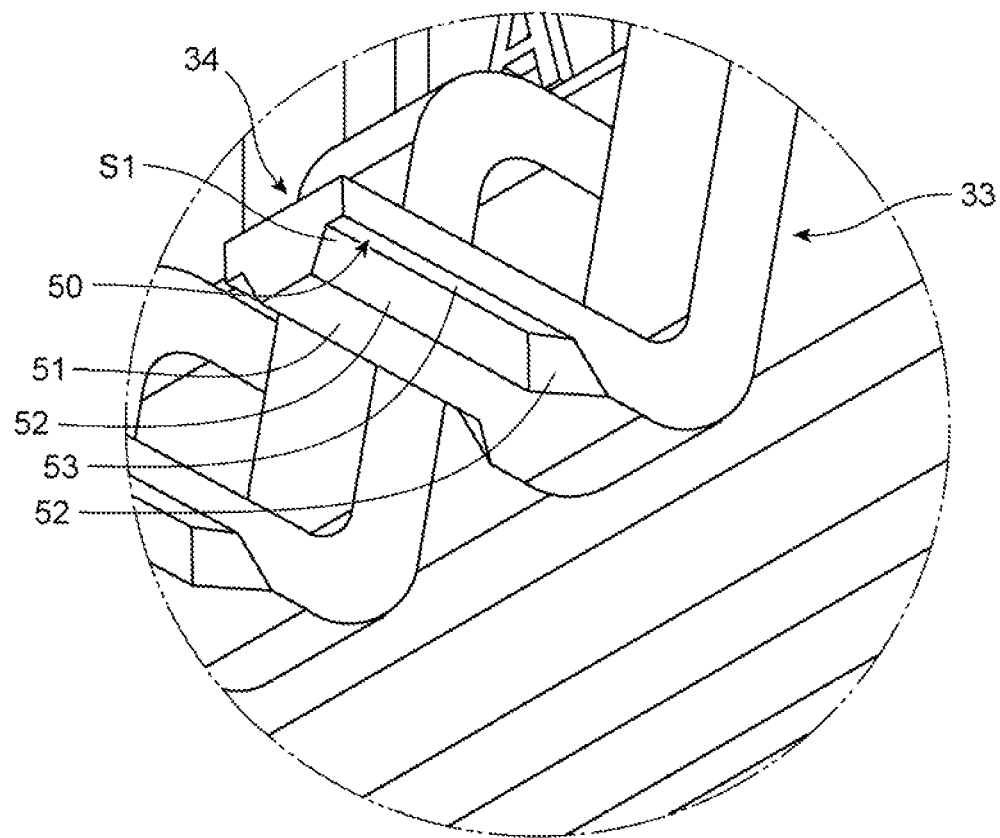
FIG. 3G is an enlarged view of the portion A shown in FIG. 2.
Figure 4A:
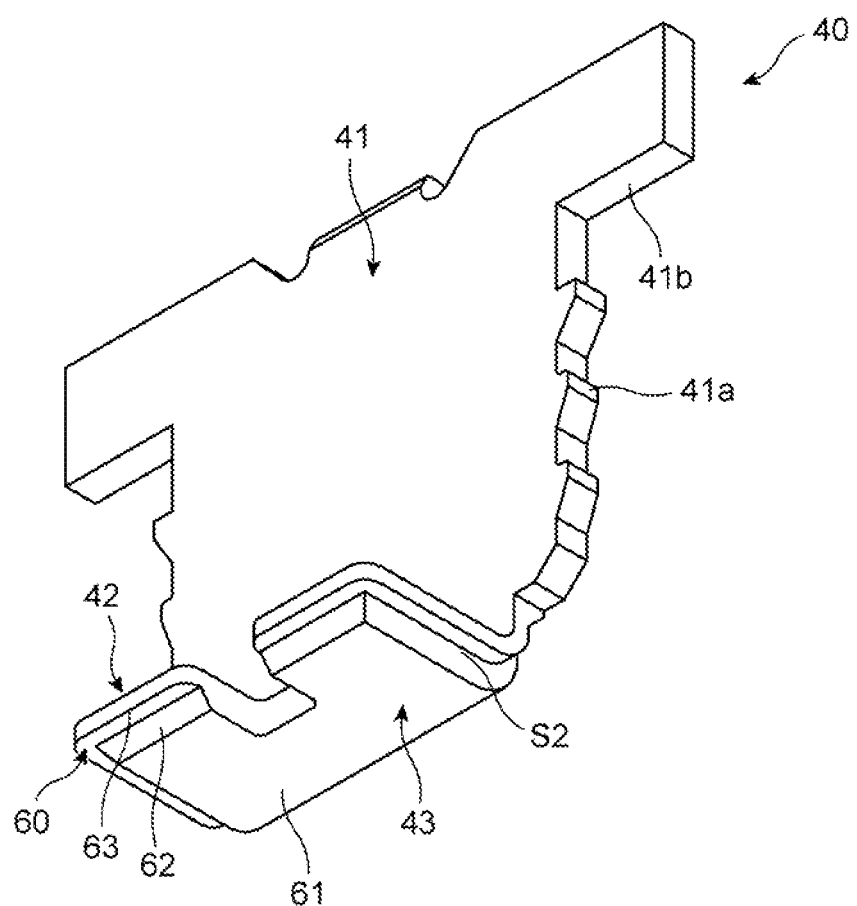
FIG. 4A is a lower perspective view of the fixing part for fixing the electric connector illustrated in FIG. 1 onto a printed circuit board.
Figure 4B:
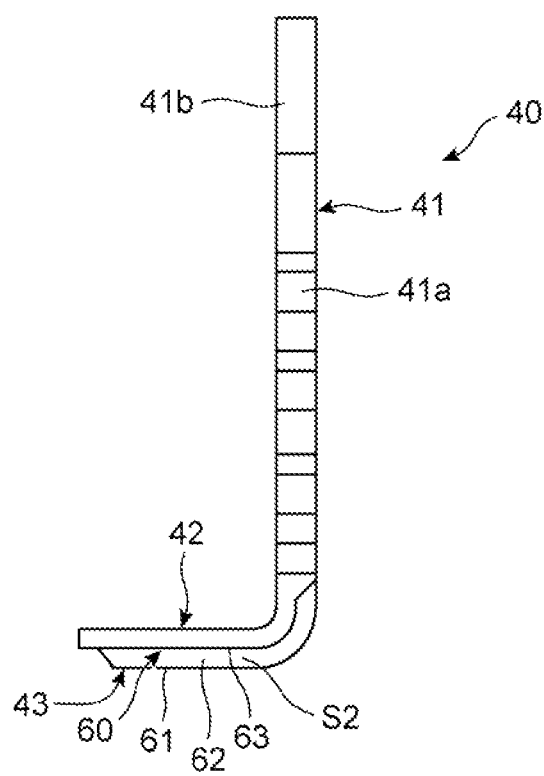
FIG. 4B is a right side view of the fixing part.
Figure 4C:
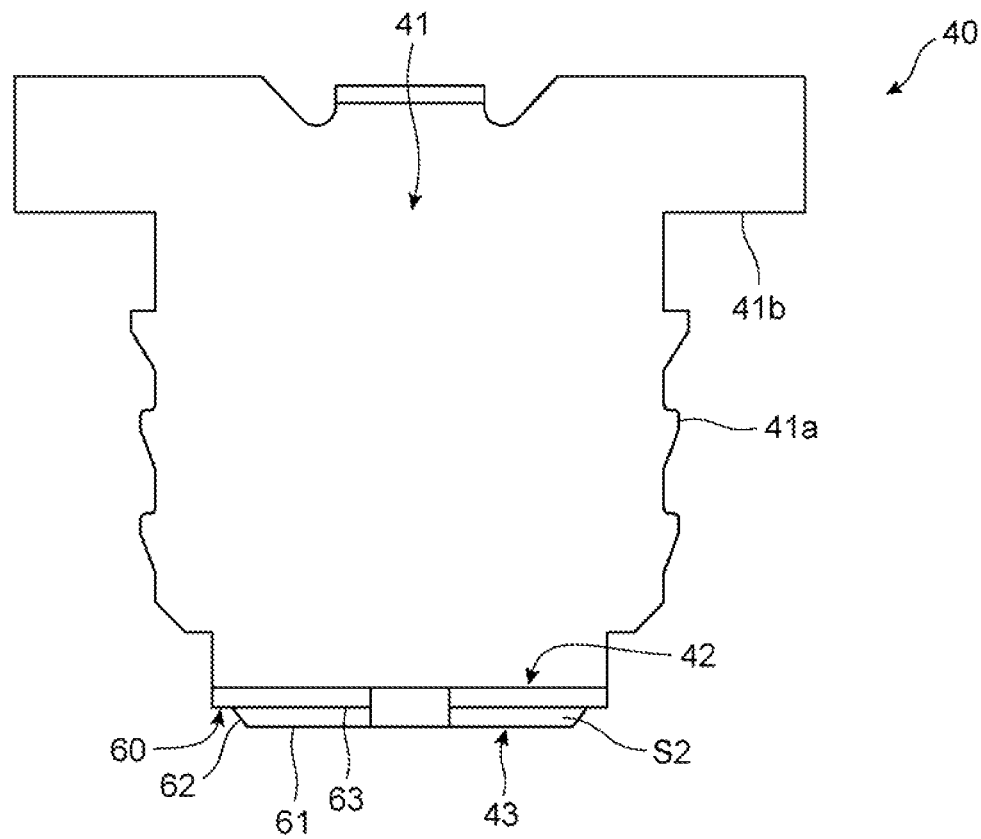
FIG. 4C is a front view of the fixing part.
Figure 4D:
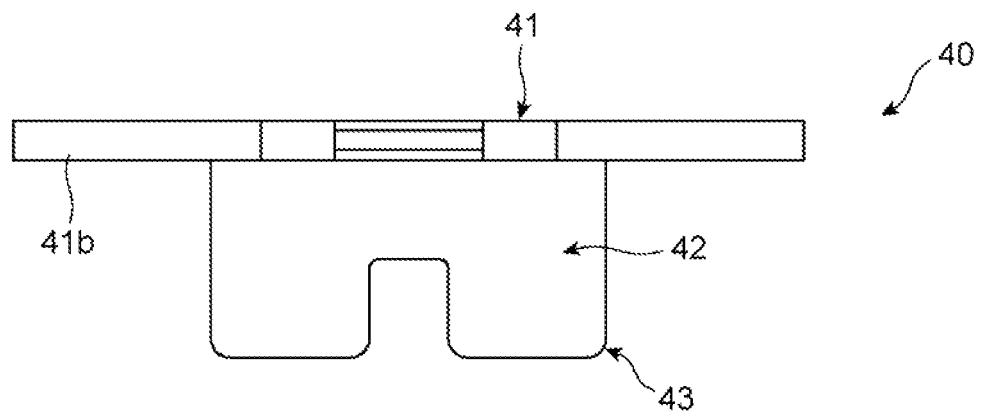
FIG. 4D is a plan view of the fixing part.
Figure 4E:
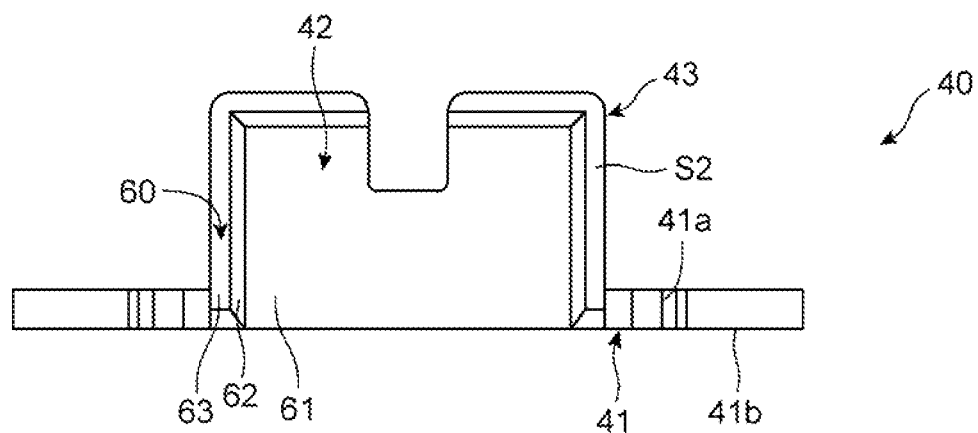
FIG. 4E is a bottom view of the fixing part.
Figure 4F:
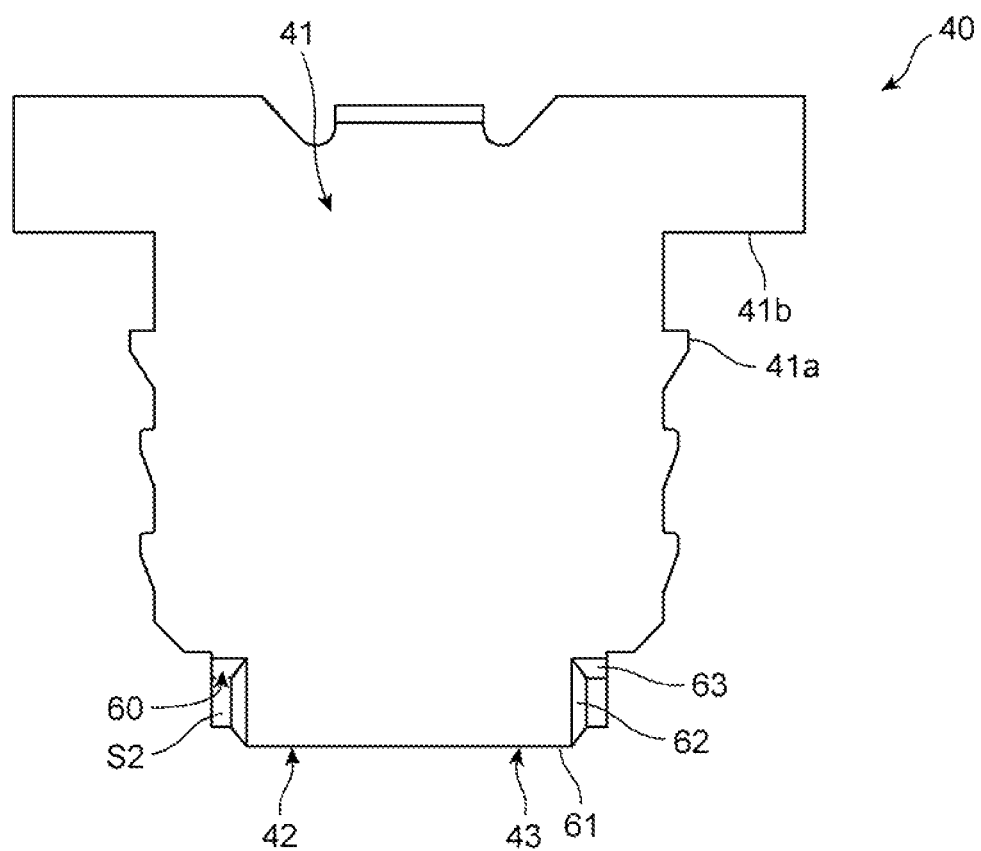
FIG. 4F is a rear view of the fixing part.
Figure 4G:
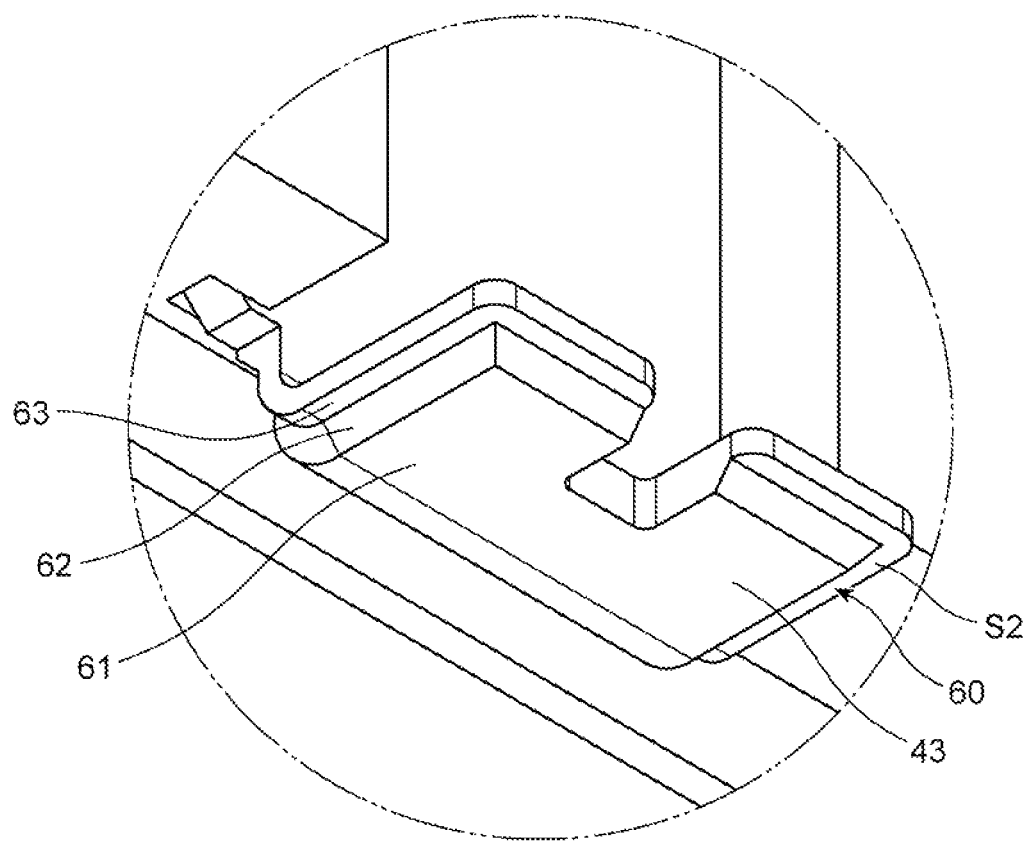
FIG. 4G is an enlarged view of the portion B shown in FIG. 2.
Figure 5B:
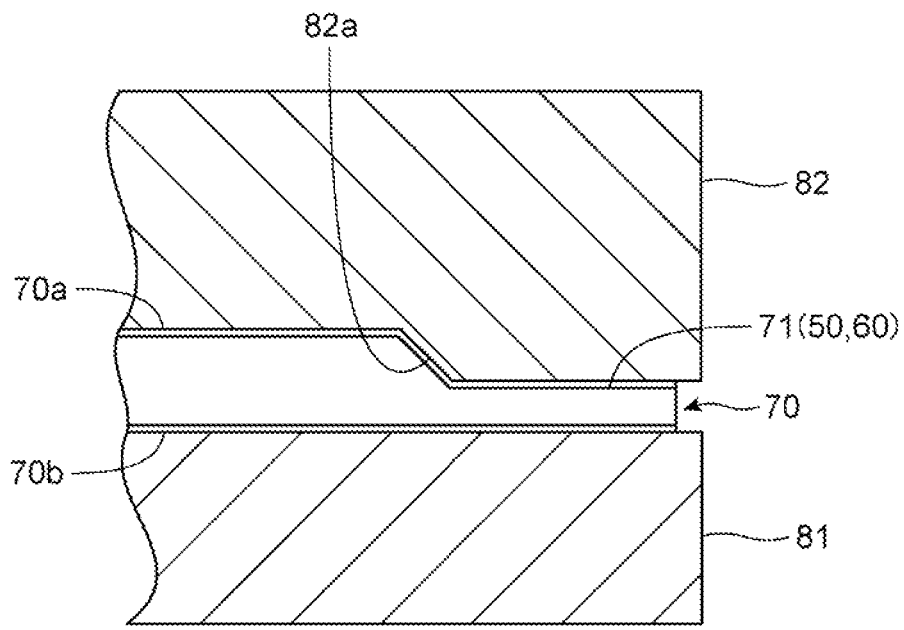

A punch 82 has a projection 82a corresponding in shape to the stepped portions 50 and 60 (see FIGS. 3G and 4G). The square bar or the plate is pressed by the punch 82 in a direction from the upper surface 70a towards the lower surface 70b to thereby collapse the margin portion 70, as illustrated in FIG. 5B. Thus, the margin portion 70 is formed with a stepped portion 71 which will make the stepped portion 50 or 60. The upper surface 70a indicates a surface through which the connector terminal 30 or the fixing part 40 is soldered onto the metal pad P1 or P2, respectively.

Figure 5C:
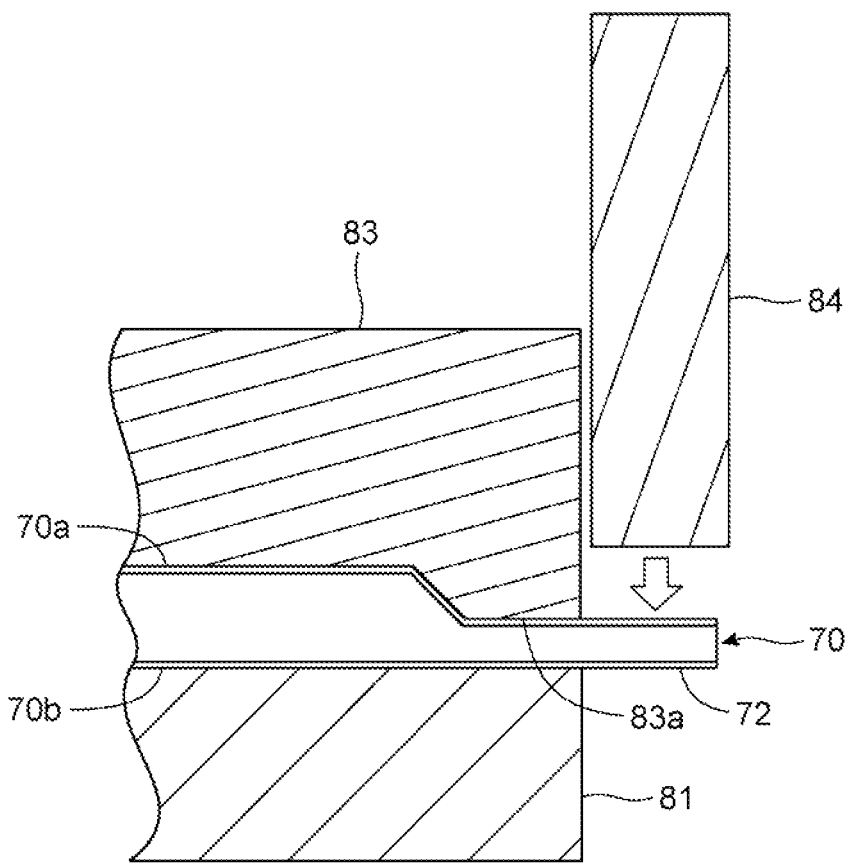
Figure 5D:
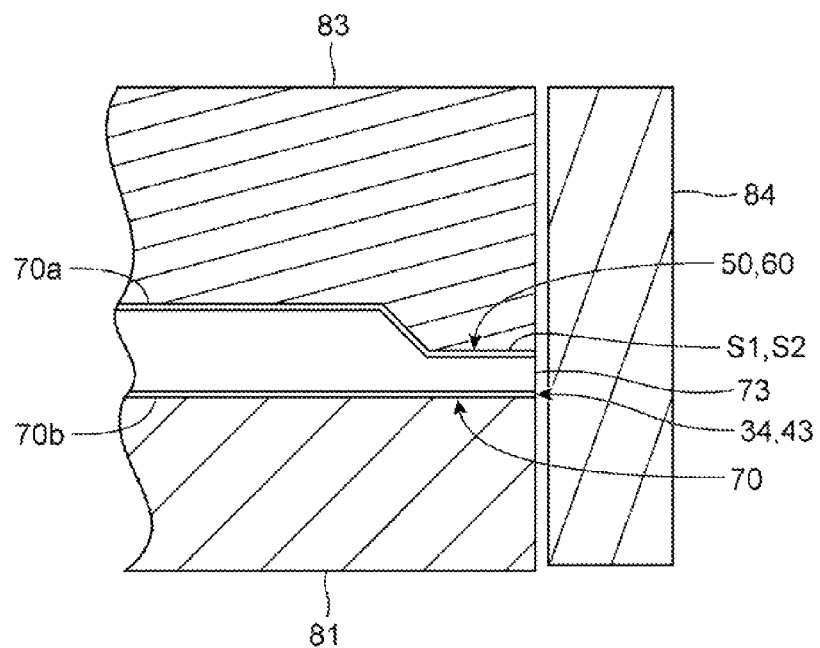

Then, the margin portion 70 is sandwiched between the die 81 and a stripper 83 having a projection 83a having the same shape as that of the stepped portion 71, as illustrated in FIG. 5C. By collapsing or rolling the margin portion 70 by means of the punch 82, there is formed a surplus portion 72 as an extension of the margin portion 70. As illustrated in FIG. 5D, the surplus portion 72 is cut by means of a punch 84. The surplus portion 72 is cut by means of the punch 84 from the upper surface 70a, that is, a surface through which the connector terminal 30 or the fixing part 40 is soldered onto the metal pad P1 or P2, respectively, towards the lower surface 70b.

In accordance with the above-mentioned steps, the contact portions 34 and 43 can be formed at the margin portion 70 thereof with the stepped portions 50 and 60. As illustrated in FIG. 5D, by collapsing the margin portion 70 to thereby define the spaces S1 and S2 for storing solder therein, the second surface 52 or 62 and the third surface 53 or 63 (see FIGS. 3G and 4G) defining the spaces S1 and S2 can be comprised of a surface covered with the plated layer 70a.

Figure 6A:
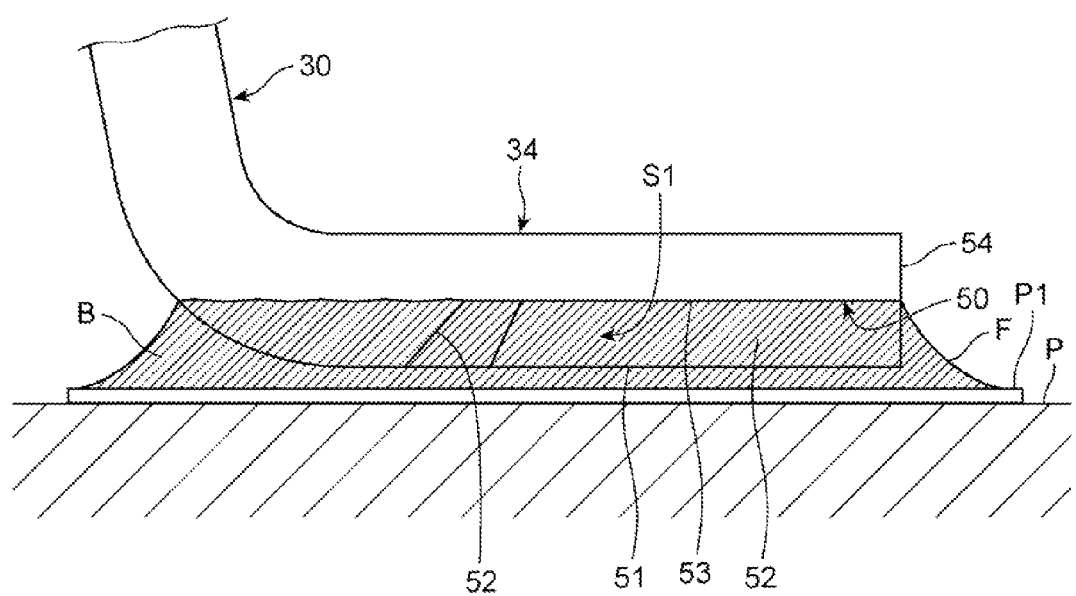
FIG. 6A is a side view of the connector terminal soldered onto a printed circuit board, the connector terminal being comprised of the electric part illustrated in FIG. 3A.
Figure 7A:
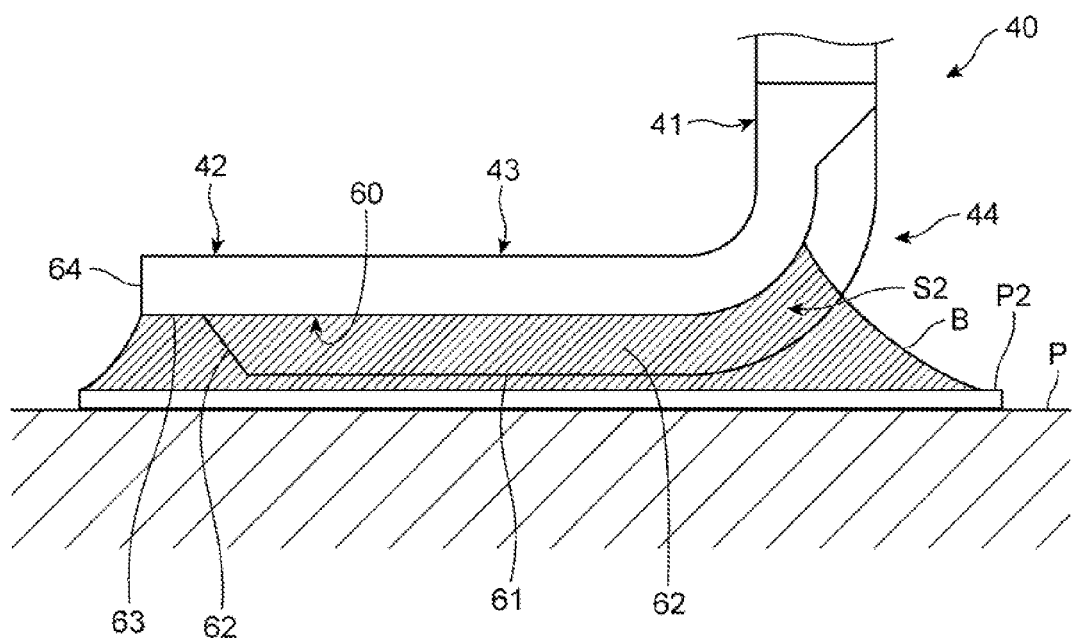
FIG. 7A is a side view of the fixing part soldered onto a printed circuit board, the fixing part being comprised of the electric part illustrated in FIG. 4A.

Furthermore, as illustrated in FIG. 5D, the surplus portion 72 formed by rolling the margin portion 70, that is, by reducing a thickness of the margin portion 70 is cut by means of the punch 84 in a direction from the upper surface 70a, that is, a surface through which the connector terminal 30 or the fixing part 40 is soldered onto the metal pad P1 or P2, respectively, towards the lower surface 70b (see FIGS. 6A and 7A). Though burr is generated at an end surface 73 of the margin portion 70 by cutting the surplus portion 72, such burr is generated at an edge located oppositely to the printed circuit board P, ensuring that the burr does not interfere with the connector terminal 30 or the fixing part 40 being soldered onto the metal pad P1 or P2, respectively.

After forming the contact portion 34 or 43 at the margin portion 70, the square bar is bent into an L-shape to thereby define the outer lead 33, or the plate is bent into an L-shape to thereby define the leg 42.

The contact portion 34 or 43 of the electric part (specifically, the connector terminal 30 and the fixing part 40) in the electric connector in accordance with the embodiment of the present invention is soldered onto the metal pad P1 or P2, as follows.

Figure 6B:
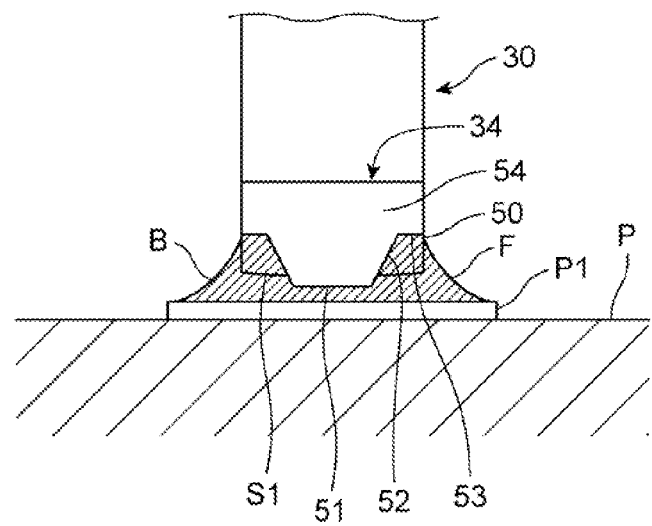
FIG. 6B is a rear view of the connector terminal illustrated in FIG. 6A.

As illustrated in FIGS. 6A and 6B, the connector terminal 30 is soldered onto the metal pad P1 through the contact portion 34. The first surface 51 is covered with solder B, and the space S1 is filled with solder B. The solder B filling the space S1 therewith is adhered to the second surface 52 and the third surface 53. For instance, the contact portion 34 is able to increase an area through which the contact portion 34 is soldered onto the metal pad P1, by an area of the second surface 52 in comparison with a contact portion not formed with the stepped portion 50.

Furthermore, since the connector terminal 30 is already plated, even if an end surface 54 of the contact portion 34 is not plated, the solder filling the space S1 therewith can have a height defined by the stepped portion 50, and thus, there is formed a fillet F having a trapezoidal cross-section obliquely extending from the third surface 53 to a surface of the metal pad P1 (see FIG. 6A).

Thus, the contact portion 34 can increase an area through which the connector terminal 30 is soldered onto the metal pad P1, and form the fillet F between the connector terminal 30 and the metal pad P1, ensuring that a peel resistance of the connector terminal 30 against the metal pad P1 is increased, and reliability is enhanced in electrical connection between the connector terminal 30 and the metal pad P1.

Since the fillets 105 are formed by cutting the notch 104 in the conventional terminal 100 illustrated in FIGS. 11A to 11D, it is afraid that the resultant fillets 105 cannot have a uniform shape, and that a constant peel resistance of the terminal 100 against being peeled off cannot be obtained. In contrast, since the contact portion 34 is collapsed at the margin portion 70 thereof to thereby form the stepped portion 50 in the connector terminal 30 in accordance with the embodiment, it is possible to form the second and third surfaces 52 and 53 both having a constant area, ensuring that a constant peel resistance of the connector terminal 30 against being peeled off the metal pad P1 can be obtained.

Furthermore, since the second surface 52 inclines relative to the first surface 51, it is possible for the connector terminal 30 to have an area through which the connector terminal 30 is soldered onto the metal pad P1, in comparison with a case in which the second surface 52 is designed to vertically stand relative to the first surface 51, ensuring a peel resistance of the connector terminal 30 against the metal pad P1 can be further enhanced.

For instance, if the contact portion is defined at an outer surface thereof only by an inclining surface, a fillet will rise at an upper portion thereof to an upper portion of the inclining surface, resulting in that the fillet is quite thin at an upper portion thereof, and hence, solder wettability is quite deteriorated.

The fillet F in the contact portion 34 is formed to obliquely extend from the third surface 53 to a surface of the metal pad P1, that is, the fillet F is in the form of a right-angled triangle. Accordingly, the fillet F can have a sufficient thickness even at an upper portion thereof.

As explained so far, since the connector terminal 30 is designed to have the stepped portion 50 at the contact portion 34, the connector terminal 30 can be surely soldered onto the metal pad P1 formed at a surface of the printed circuit board P.

Figure 7B:
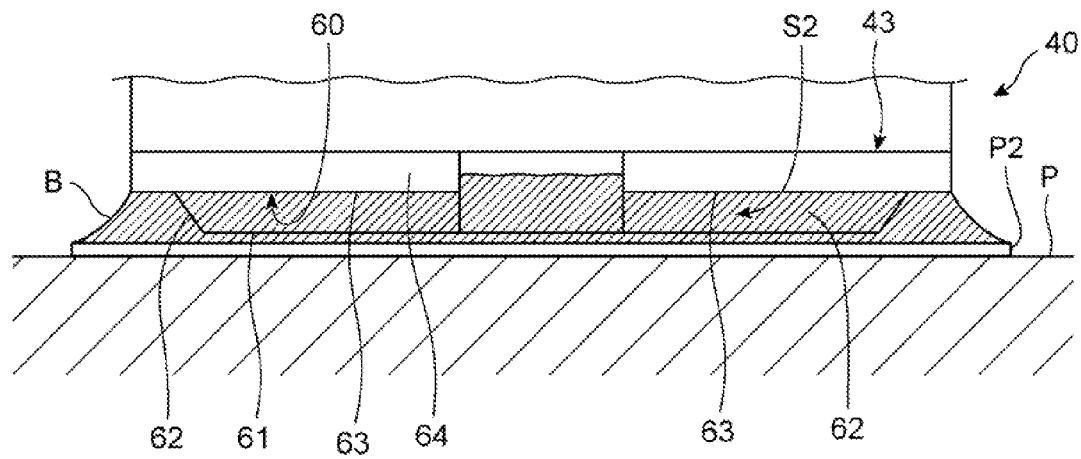
FIG. 7B is a rear view of the connector terminal illustrated in FIG. 7A.

As illustrated in FIGS. 7A and 7B, the fixing part 40 is soldered onto the metal pad P2 through the contact portion 43. The first surface 51 is covered with solder B, and the space S2 is filled with solder B. The solder B filling the space S2 therewith is adhered to the second surface 52 and the third surface 53.

Similarly to the connector terminal 30, the contact portion 43 is able to increase an area through which the fixing part 40 is soldered onto the metal pad P2, by an area of the second surface 62 in comparison with a contact portion not formed with the stepped portion 60.

Furthermore, since the fixing part 40 is already plated, even if an end surface 64 of the contact portion 43 is not plated, the solder filling the space S2 therewith can have a height defined by the stepped portion 60, and thus, there is formed a fillet F having a trapezoidal cross-section obliquely extending from the third surface 53 to a surface of the metal pad P2 (see FIG. 7A).

Thus, the contact portion 43 can increase an area through which the fixing part 40 is soldered onto the metal pad P2, and form the fillet F between the fixing part 40 and the metal pad P2, ensuring that a peel resistance of the fixing part 40 against the metal pad P2 is increased, and reliability is enhanced in electrical connection between the fixing part 40 and the metal pad P2.

Furthermore, the contact portion 43 defined by the first to third surfaces 61 to 63 is formed from the leg 42 horizontally extending and facing the metal pad P2, to the main body 41 vertically extending relative to the metal pad P2, through a corner portion 44 connecting the leg 42 and the main body 41 to each other, and hence, the solder B covers therewith not only a horizontally extending surface of the leg 42, but also an arcuate surface of the corner portion 44 and a vertically extending surface of the main body 41. Thus, an area through which the fixing part 40 is soldered onto the metal pad P2 can be increased.

As explained so far, since the fixing part 40 is designed to have the stepped portion 60 at the contact portion 43, the fixing part 40 can be surely soldered onto the metal pad P2 formed at a surface of the printed circuit board P.

Hereinbelow is explained a case in which a connector terminal or a fixing part is first made of a non-plated metal, and then, they are plated with a metal.

Figure 8A:
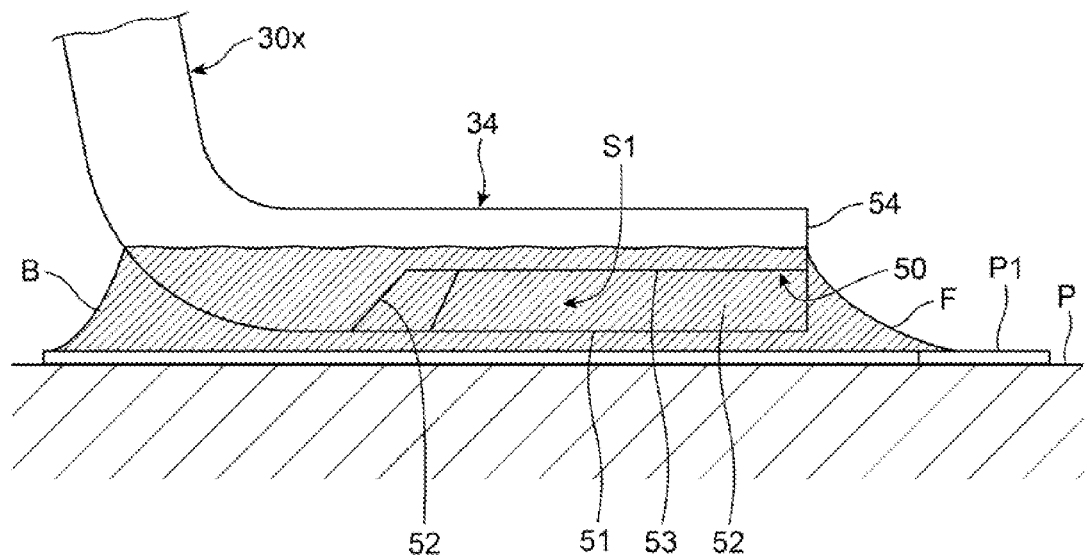
FIG. 8A is a side view of the connector terminal soldered onto a printed circuit board.
Figure 8B:
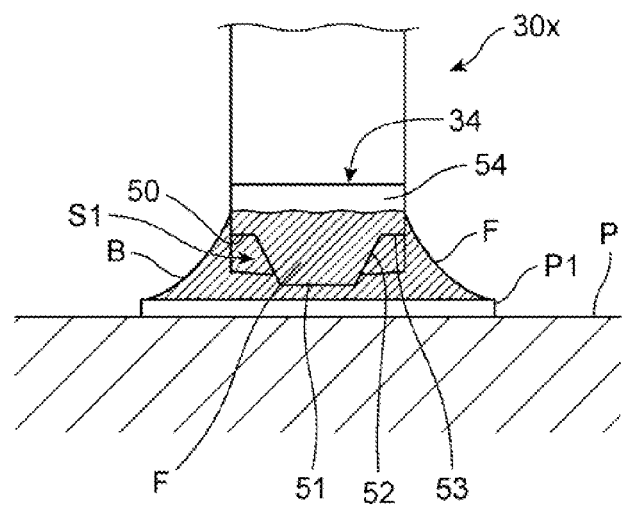
FIG. 8B is a rear view of the connector terminal illustrated in FIG. 8A.

As illustrated in FIGS. 8A and 8B, a connector terminal 30X is plated after being fabricated of a non-plated metal, and hence, the contact portion 34 including an end surface 54 is covered entirely with a plated layer.

Since the end surface 54 is plated, the fillet F is able to have a height higher than the third surface 53. Thus, a peel resistance of the connector terminal 30X against the metal pad P1 can be increased by virtue of an increase in an area through which the connector terminal 30X is soldered onto the metal pad P1, caused by the end surface 54 of the contact portion 34, and further, by virtue of the fillet F having an increased height.

Furthermore, as illustrated in FIG. 8B, since the stepped portion 50 is formed at opposite sides of the contact portion 34, the solder B is adhered not only to a portion of the end surface 54 located higher than the third surface 53, but also to a portion of the end surface 54 sandwiched between the spaces 51 and S2 to thereby define the fillet F, ensuring that an area through which the connector terminal 30X is soldered onto the metal pad P1 can be further increased.

Figure 9A:
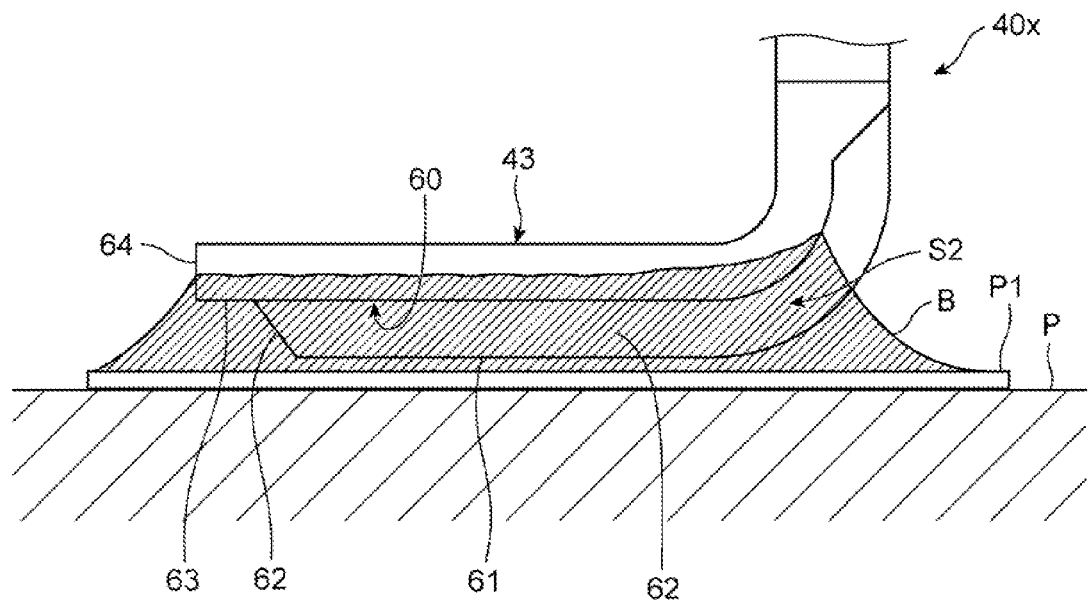
FIG. 9A is a side view of the fixing part soldered onto a printed circuit board.
Figure 9B:
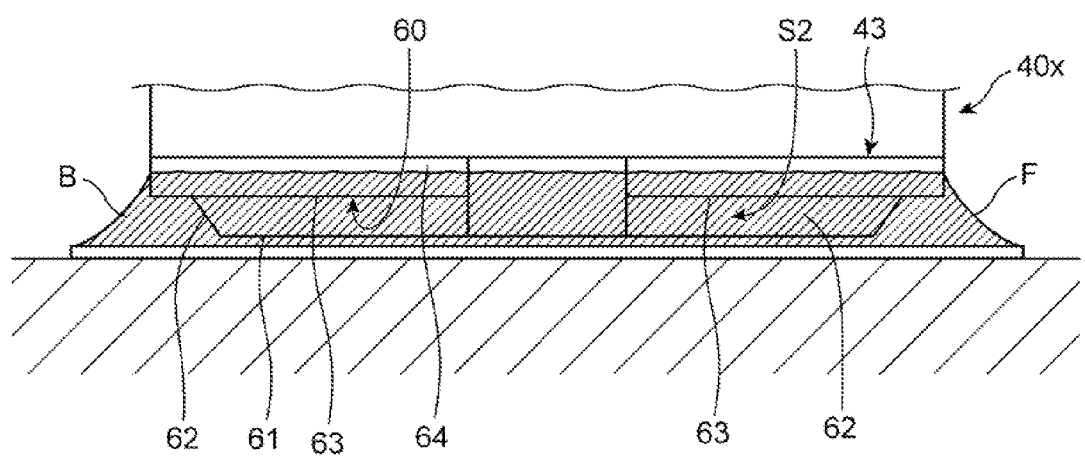
FIG. 9B is a rear view of the connector terminal illustrated in FIG. 9A.

As illustrated in FIGS. 9A and 9B, a fixing part 40X is plated after being fabricated of a non-plated metal, and hence, the contact portion 43 including an end surface 64 is covered entirely with a plated layer.

Similarly to the connector terminal 30X, since the end surface 64 is plated, the fillet F is able to have a height higher than the third surface 63. Thus, a peel resistance of the fixing part 40X against the metal pad P2 can be increased by virtue of an increase in an area through which the fixing part 40X is soldered onto the metal pad P2, caused by the end surface 64 of the contact portion 43, and further, by virtue of the fillet F having an increased height.

The applicant carried out an experiment to compare a peel resistance among the fixing part 40 fabricated of a plated metal, a fixing part 40Y fabricated of a plated metal, but not formed with the stepped portion 60, a fixing part 40Z first fabricated of a non-plated metal, and then, plated, and not formed with the stepped portion 60, and the above-mentioned fixing part 40X first fabricated of a non-plated metal, and then, plated, and formed with the stepped portion 60.

Figure 10:
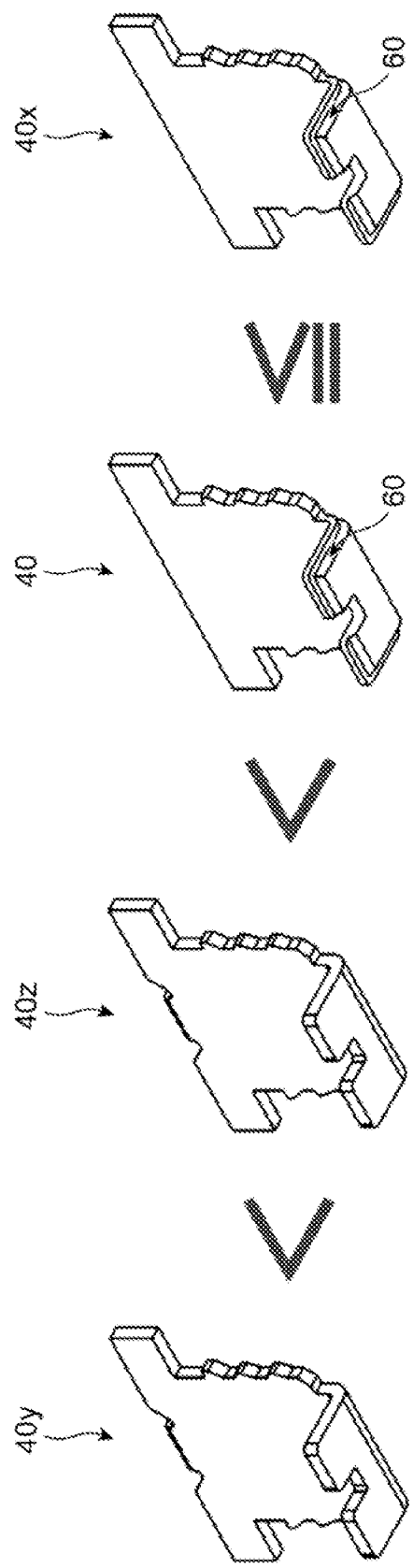
FIG. 10 illustrates the comparison between the fixing part in accordance with the present invention and the conventional electric part with respect to a peel resistance of them.

As illustrated in FIG. 10, the peel resistance is higher in an order of the fixing part 40X, the fixing part 40, the fixing part 40Z, and the fixing part 40Y. In particular, the fixing part 40 has the peel resistance 1.5 times greater than the peel resistance of the fixing part 40Z.

It is understood in view of the result that the fixing part 40 having the contact portion 43 formed with the spaces S2 is able to effectively enhance the peel resistance relative to the fixing part 40Z. Furthermore, it is also understood that since the end surface 64 (see FIGS. 9A and 9B) can be plated by fabricating the fixing part 40 of a non-plated metal, and then, plating the same, the peel resistance can be further enhanced.

In the above-mentioned embodiment, the first to third surfaces 51 to 53 or 61 to 63 are all designed to be flat. As an alternative, the first, second and/or third surfaces may be formed with a plurality of recesses or grooves. This ensures that a total area through which the connector terminal 30 or the fixing part 40 is soldered onto the metal pad P1 or P2 can be increased.

INDUSTRIAL APPLICABILITY

The electric part in accordance with the present invention, such as the connector terminal 30 and the fixing part 40, is suitable to an electric connector used broadly in fields such as an automobile industry, an electric/electronic device industry, and a machinery industry, as a communication device for an electric wire through which electric signals are transmitted.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2013-195877 filed on Sep. 20, 2013 including specification, claims, drawings and summary is incorporated herein by reference in its entirety.

What is claimed is:

1. An electric part to be soldered to a metal pad formed at a surface of a printed circuit board, said electric part comprising:
    a first portion facing said metal pad;
    a second portion extending in a direction away from said metal pad; and
    a corner portion connecting said first portion and said second portion to each other,
    wherein the first portion includes:
        a single first surface facing said metal pad;
        a pair of second surfaces each extending from one of side edges of said first surface in a direction away from said metal pad; and
        a pair of third surfaces each outwardly extending from one of said second surfaces,
    wherein said first surface, said second surfaces, and said third surfaces are formed over said first portion to said second portion through said corner portion,
    wherein a direction in which each of said third surfaces extends is perpendicular to a direction in which said first portion connects to said corner portion,
    wherein said second surfaces and said third surfaces define a pair of spaces in each of which solder is stored, each of said spaces extending along one of said side edges of said first surface, and
    wherein said electric part further comprises a metal plate which is (i) plated at both said first surface and an outer surface of said first portion parallel to the first surface and (ii) not plated at an end surface perpendicular to both said first surface and said outer surface.

2. The electric part as set forth in claim 1, wherein each of said second surfaces inclines relative to said first surface.

3. The electric part as set forth in claim 1, wherein at least one of said first surface, said second surfaces, and said third surfaces is formed with a plurality of recesses.

4. An outer lead of a connector terminal to be soldered to a metal pad formed at a surface of a printed circuit board, said outer lead comprising:
    a first portion facing said metal pad;
    a second portion extending in a direction away from said metal pad; and
    a corner portion connecting said first portion and said second portion to each other,
    wherein the first portion includes:
        a single first surface facing said metal pad;
        a pair of second surfaces each extending from one of side edges of said first surface in a direction away from said metal pad; and
        a pair of third surfaces each outwardly extending from one of said second surfaces,
    wherein said first surface, said second surfaces, and said third surfaces are formed over said first portion to said second portion through said corner portion,
    wherein a direction in which each of said third surfaces extends is perpendicular to a direction in which said first portion connects to said corner portion, wherein said second surfaces and said third surfaces define a pair of spaces in each of which solder is stored, each of said spaces extending along one of said side edges of said first surface, and wherein said outer lead further comprises a metal plate which is (i) plated at both said first surface and an outer surface of said first portion parallel to the first surface and (ii) not plated at an end surface perpendicular to both said first surface and said outer surface.

5. The outer lead as set forth in claim 4, wherein each of said second surfaces inclines relative to said first surface.

6. The outer lead as set forth in claim 4, wherein at least one of said first surface, said second surfaces, and said third surfaces, is formed with a plurality of recesses.

7. An electric part through which a housing is fixed onto a printed circuit board, said electric part comprising:
    a first segment making contact with said housing; and
    a second segment soldered to said printed circuit board, wherein said second segment includes:
        a first portion facing said printed circuit board;
        a second portion extending in a direction away from said printed circuit board; and
        a corner portion connecting said first portion and said second portion to each other,
    wherein the first portion includes:
        a single first surface facing said printed circuit board;
        a pair of second surfaces each extending from one of side edges of said first surface in a direction away from said printed circuit board; and
        a pair of third surfaces each outwardly extending from one of said second surfaces,
    wherein said first surface, said second surfaces, and said third surfaces are formed over said first portion to said second portion through said corner portion,
    wherein a direction in which each of said third surfaces extends is perpendicular to a direction in which said first portion connects to said corner portion,
    wherein said second surfaces and said third surfaces define a pair of spaces in each of which solder is stored, each of said spaces extending along one of said side edges of said first surface, and
    wherein said outer lead further comprises a metal plate which is (i) plated at both said first surface and an outer surface of said first portion parallel to the first surface and (ii) not plated at an end surface perpendicular to both said first surface and said outer surface.

8. The electric part as set forth in claim 7, wherein each of said second surfaces inclines relative to said first surface.

9. The electric part as set forth in claim 7, wherein at least one of said first surface, said second surfaces, said third surfaces is formed with a plurality of recesses.

10. A method of fabricating an electric part to be soldered to a metal pad formed at a surface of a printed circuit board, the method comprising:
    punching a metal to make a base part having a predetermined contour;
    reducing a thickness of said base part at a margin thereof to thereby define a single first surface, a pair of second surfaces, and a pair of third surfaces in such a manner that said first surface faces said metal pad, each of said second surfaces extends from one of side edges of said first surface in a direction away from said metal pad, and each of said third surfaces outwardly extends from one of said second surfaces, said second surfaces and said third surfaces define a pair of spaces in each of which solder is stored, each of said spaces extending along one of said side edges of said first surface; and
    bending said base part to define a first portion facing said metal pad, a second portion extending away from said metal pad, and a corner portion connecting said first portion and said second portion to each other, said first surface, said second surfaces, and said third surfaces being formed over said first portion to said second portion through said corner portion,
    wherein a direction in which each of said third surfaces extends is perpendicular to a direction in which said first portion connects to said corner portion, and
    wherein said outer lead further comprises a metal plate which is (i) plated at both said first surface and an outer surface of said first portion parallel to the first surface and (ii) not plated at an end surface perpendicular to both said first surface and said outer surface.

11. The method as set forth in claim 10, further comprising cutting an extended portion of said base part formed by reducing the thickness of said base part, in a direction from a surface through which said electric part is soldered to said printed circuit board towards an opposite surface.

* * * * *